United States Patent
Jain et al.

(10) Patent No.: US 6,829,553 B2
(45) Date of Patent: Dec. 7, 2004

(54) METHOD OF AND APPARATUS FOR MEASURING THE CORRECTNESS OF AND CORRECTING AN AUTOMATIC TEST ARRANGEMENT

(75) Inventors: Sunil K. Jain, Folsom, CA (US); Greg P. Chema, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 591 days.

(21) Appl. No.: 09/821,115

(22) Filed: Mar. 30, 2001

(65) Prior Publication Data

US 2002/0144197 A1 Oct. 3, 2002

(51) Int. Cl.$^7$ .............................................. G01R 31/28
(52) U.S. Cl. ...................... 702/120; 714/733; 714/724; 324/763; 324/537
(58) Field of Search ........................ 702/91, 117, 118, 702/120; 714/733–738, 724; 324/764, 647, 537, 158.1

(56) References Cited

U.S. PATENT DOCUMENTS

| | | | | |
|---|---|---|---|---|
| 5,101,153 A | * | 3/1992 | Morong, III | ................. 324/537 |
| 6,202,030 B1 | * | 3/2001 | Hitchcock | ..................... 702/85 |
| 6,289,293 B1 | * | 9/2001 | Huang | ........................ 702/117 |
| 6,570,397 B2 | * | 5/2003 | Mayder et al. | ............. 324/754 |
| 6,665,627 B2 | * | 12/2003 | Jain et al. | ................... 702/117 |

* cited by examiner

Primary Examiner—Kamini Shah
(74) Attorney, Agent, or Firm—Kenyon & Kenyon

(57) ABSTRACT

A method of and an apparatus for determining the correctness of the calibration of an automatic test arrangement and correcting errors in the automatic test arrangement. The electrical length is determined from the tester driver of the automatic test arrangement to the socket pin of the tester interface unit, from the tester driver to a grounding point of the device under test, from the tester driver to the tester interface unit, and with the tester interface unit output pin connected to ground by a shorting block from the tester driver through the shorting block ground. The difference between the first electrical length and the second electrical length is compared with the difference between the first electrical length and the third electrical length, and the result is evaluated to determine the correctness of the calibration of the automatic test arrangement.

36 Claims, 2 Drawing Sheets

METHOD OF AND APPARATUS FOR MEASURING THE CORRECTNESS OF AND CORRECTING AN AUTOMATIC TEST ARRANGEMENT

FIELD

The present invention pertains to automatic test arrangements for automatic testing of devices. More particularly, the present invention pertains to a method of and an apparatus for determining the correctness of the calibration of an automatic test arrangement and a method of and apparatus for correcting the fundamental calibration errors inherent in automatic test equipment, arrangements, and/or environments.

BACKGROUND

Newly manufactured products are generally tested prior to being delivered to customers in order to assure that the products perform as desired. In high volume manufacturing of products, such as electronic components, such acceptance testing is often performed by automatic test equipment. The test results, however, are only as good as the calibration of the automatic test equipment. This is a problem in general in acceptance testing, and it is a particular and fundamental problem in the acceptance testing of electronic components since the available operating speeds of such components are increasing, and the component operating speed is often faster than the operating speed of the automatic test equipment. Methods of calibration presently used, known, and/or available are limited in accuracy and have associated inherent errors. Consequently, in order to accurately evaluate and correct the results of testing by automatic test equipment, it is necessary to determine the correctness of the calibration of the automatic test equipment and to make and/or embed any modification and/or corrections to the base tester calibration and/or the test results that are necessary to obtain meaningful results.

The present invention is applicable to automatic test equipment, automatic test arrangements, and automatic test environments. In the following, these will all be referred to as automatic test arrangements, but it is to be understood that equipment, arrangements, and environments are included, as well as other appropriate meanings.

FIG. 1 is a block diagram commonly considered to depict an automatic test arrangement testing a device. Tester driver 10 applies a test signal to pin electronics card 12, the output of which is connected to the input of tester interface unit 16. The output of tester interface unit 16 is connected to the device under test 20. Tester driver 10, and pin electronics card 12, might be a piece of general purpose automatic test equipment, while tester interface unit 16 is specifically adapted for testing of the particular device under test 20 on such a general purpose automatic test equipment.

The automatic test arrangement of FIG. 1 can test device under test 20 by determining the electrical length of the signal path from tester driver 10 to device under test 20, using time domain reflectometry. A signal is applied from tester driver 10, through pin electronics card 12 and tester interface unit 16 to device under test 20, and a resulting reflected signal is returned to tester driver 10. The time between initiation of the signal by tester driver 10 and receipt of the reflected signal at tester driver 10 is used to determine whether device under test 20 is acceptable, as is well known in the art. That time is referred to as the electrical length of the signal path.

In practice the automatic test arrangement is calibrated with no device connected to the output of tester interface unit 16. This calibration electrical length is:

$$EL = PEC + TIU$$

where EL is electrical length, PEC is the electrical length of pin electronics card 12, and TIU is the electrical length of tester interface unit 16. This electrical length might be determined under various conditions. One condition is with no ground connections. A second is with the output of tester interface unit 16 connected to ground by a grounding block. A third condition is with the output of pin electronics card 12 connected to ground by a first grounding block and the output of tester interface unit 16 connected to ground by a second grounding block. While each of these methods produces a calibration value for the automatic test arrangement, the calibration values differ, and, in fact, none of them is wholly accurate because none of them considers all of the electrical lengths involved in the test arrangement. Nevertheless, these three conditions are frequently used variously to calibrate automatic test equipment.

The electrical length of the automatic test equipment made up of tester driver 10 and pin electronics card 12 is generally tested to obtain a first calibration value which might be stored in a memory device of the pin electronics card. Because not all electrical lengths are considered, the measured value is the actual electrical length of the pin electronics card plus a calibration adjustment. One such value might be obtained and stored with the output of the pin electronics card open and another value obtained and stored with that output shorted to ground.

A second set of calibrations is generally performed to determine the electrical length of the pin electronics card and the tester interface unit, both with the tester interface unit output open, and with that output shorted to ground, and the resulting values might be stored in a memory device of the tester interface unit. Again, however, the measured values are the electrical length of the pin electronics card and the tester interface unit plus a calibration adjustment. Even so, these stored values do not properly reflect the calibration of the automatic test arrangement because they do not take into consideration all the electrical lengths involved. Consequently, it is difficult to correctly calibrate an automatic test arrangement.

SUMMARY

The present invention pertains to automatic test arrangements for automatic testing of devices. More particularly, the present invention pertains to a method of and an apparatus for determining the correctness of the calibration of an automatic test arrangement and a method of and an apparatus for correcting fundamental calibration errors inherent in an automatic test arrangement. Such an automatic test arrangement generally includes a tester driver, a pin electronics card having an input connected to the tester driver and an output connected to an output pin such as pogo pin, and a tester interface unit having an input connected to the pin electronics card output pin and an output connected to an output pin such as a socket pin. In accordance with the present invention, the electrical length from the tester driver to the socket pin is determined taking into consideration the pin electronics card output pin and the tester interface unit output pin. The actual electrical length from the tester driver, through the pin electronics card, the pin electronics card output pin, the tester interface unit, and the tester interface unit output pin to a grounding point of the device under test is determined. In a first embodiment of the invention, a second electrical length is determined from the tester driver, through the pin electronics card and the pin electronics card output pin to the tester interface unit, with neither the pin electronics card output pin nor the tester interface unit output pin grounded. With the tester interface unit output pin connected to ground by a shorting block, a third electrical length is determined from the tester driver, through the pin electronics card, the pin electronics card output pin, the tester interface unit, the tester interface unit output pin, and the shorting block to ground. A first difference value is determined as the difference between the first electrical length and the second electrical length. A second difference value is determined as the difference between the first electrical length and the third electrical length. A third difference value is determined as the difference between the first difference value and the second difference value, and the third difference value is evaluated to determine the correctness of the calibration of the automatic test arrangement.

In another embodiment of the invention, a fourth electrical length is determined with the pin electronics card output pin connected to ground by a first shorting block and the tester interface unit output pin connected to ground by a second shorting block, the fourth electrical length being from the tester driver, through the pin electronics card, the pin electronics card output pin, the tester interface unit, the tester interface unit output pin, and the second shorting block to ground. A difference value is determined as the difference between the first electrical length and the fourth electrical length. This difference value is subtracted from the first difference value, and that result is evaluated to determine the correctness of the calibration of the automatic test arrangement.

BRIEF DESCRIPTION OF THE DRAWINGS

These and other aspects and advantage of the present invention are more apparent from the following detailed description and claims, particularly when considered in conjunction with the accompanying drawings. In the drawings:

DETAILED DESCRIPTION

Figure 2:
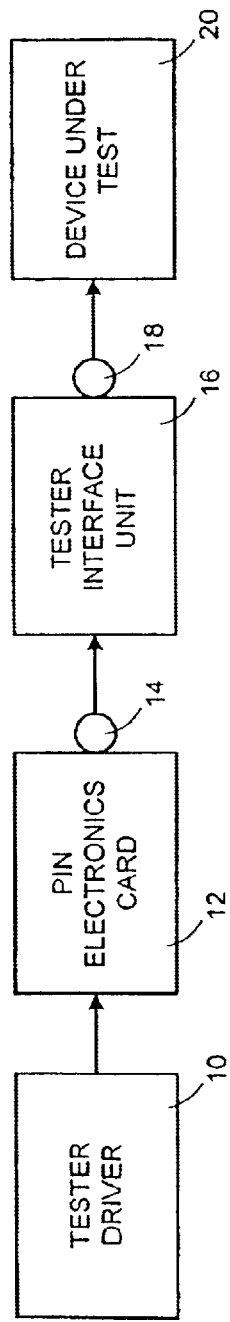
FIG. 2 is a block diagram depicting an actual automatic test arrangement testing a device.
Figure 4:
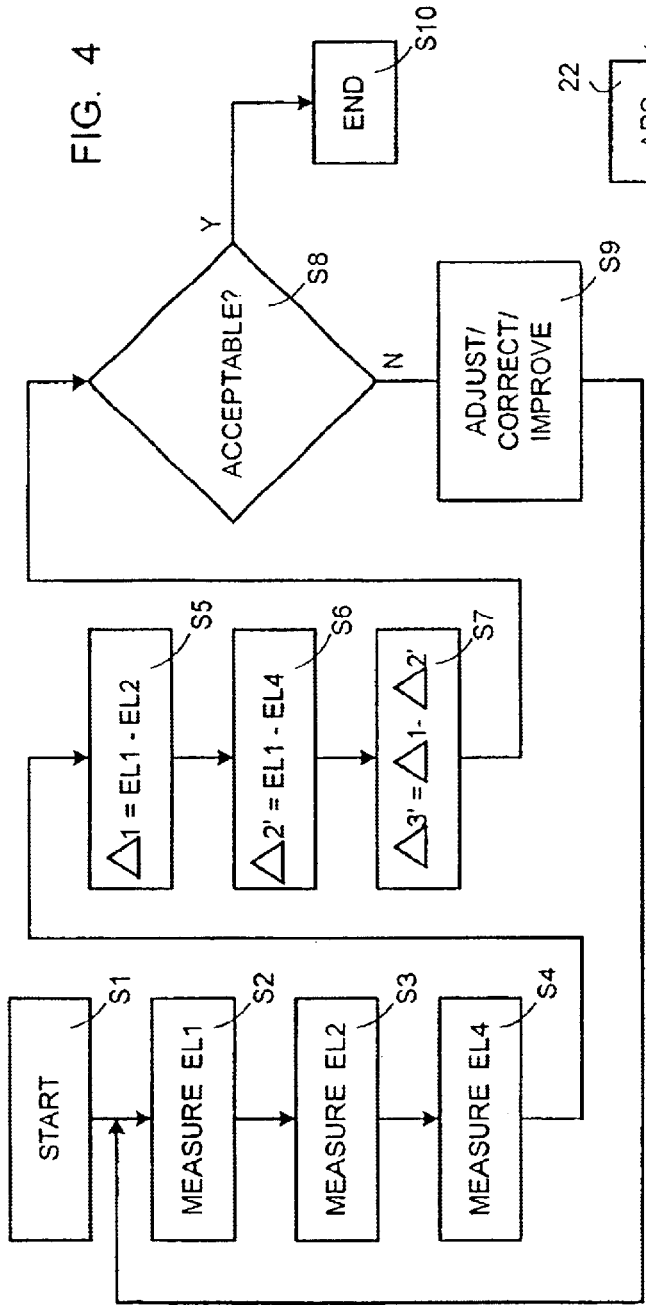
FIG. 4 is a flowchart of a second embodiment of a method of determining the correctness of the calibration of an automatic test arrangement in accordance with the present invention.

FIG. 2 is a block diagram of an automatic test arrangement in which a tester driver 10 applies a test signal to pin electronics card 12, the output of which is connected to output pin 14. The input of tester interface unit 16 is connected to pin electronics card output pin 14, while the output of tester interface unit 16 is connected to output pin 18 which is connected to the device under test 20. By way of examples, output pin 14 from pin electronics card 12 might be a pogo pin, while output pin 18 from tester interface unit 16 might be a socket pin. Tester driver 10, pin electronics card 12, and pogo pin 14 might be a piece of general purpose automatic test equipment, while tester interface unit 16 and its socket pin 18 are specifically adapted for testing of the particular device under test 20 on such a general purpose automatic test equipment. The actual electrical length from tester driver 10 to device under test 20 in FIG. 2 is given by:

$$EL(1)=PEC+Pogo\_c+TIU+Socket\_pin+\text{Shortest return path to ground} \quad (1)$$

where Pogo-c is the electrical length of pogo pin 14 when it is compressed, and Socket_pin is the electrical length of socket pin 18.

When the test arrangement is calibrated, the device under test 20 is not connected, and instead the socket pin is left open. In that configuration, the electrical length from tester driver 10 to socket pin 18 is given by:

$$EL(2)=PEC+Cal\_adj\_o+\{PEC+Pogo\_c+TIU-(PEC+Cal\_adj\_o)\} \quad (2)$$

where Cal_adj_o is the previously determined calibration adjustment value. TIU−(PEC+Cal_adj_o) might be stored in a memory device in tester interface unit 16.

With a shorting block connecting socket pin 18 to ground, the electrical length from tester driver 10 to ground through the shorting block is given by:

$$EL(3)=PEC+Cal\_adj\_o+\{PEC+Pogo\_c+TIU+Socket\_pin+Shrt\_blk\_dut-PEC-Cal\_adj\_o\} \quad (3)$$

where Shrt_blk_dut is the electrical length of the shorting block connected to socket pin 18.

With a first shorting block connecting pogo pin 14 to ground and second shorting block connecting socket pin 18 to ground, the electrical length from tester driver 14 to ground through the socket pin shorting block is given by:

$$EL(4)=\{PEC+Pogo\_c+Shrt\_blk\_pogo+Cal\_adj\_s\}+\{PEC+Pogo\_c+TIU+Socket\_pin+Shrt\_blk\_dut-PEC-Pogo\_c-Shrt\_blk\_pogo-Cal\_adj\_s\} \quad (4)$$

where Shrt_blk_pogo is the electrical length of the shorting block at pogo pin 14 and Cal_adj_s is a previously determined calibration adjustment value for the automatic test arrangement with shorting blocks on both pogo pin 14 and socket pin 18.

The values EL(1) through EL(4) are determined for an automatic test arrangement and are used to determine the correctness of the calibration of the automatic test arrangement. FIG. 2 is a flowchart of a first embodiment of a method of determining the correctness of the calibration of an automatic test arrangement in accordance with the present invention. In step SI, the method is started. In step S2, the first electrical length is measured, utilizing equation (1). Then in step S3 the second electrical length is measured utilizing equation (2), and in step S4 the third electrical length is measured, using equation (3). In step S5, the second electrical length is subtracted from the first electrical length, giving:

$$\Delta 1=EL(1)-EL(2)=Socket\_pin+\text{Shortest return path to ground} \quad (5)$$

In step S6, the third electrical length is subtracted from the first electrical length, giving:

$$\Delta 2=EL(1)-EL(3)=\text{Shortest return path to ground}-Shrt\_blk\_dut \quad (6)$$

In step S7, the result of equation (6) is subtracted from the result of equation (5), giving:

$$\Delta 3 = \Delta 1 - \Delta 2 = Socket\_pin + Shrt\_blk\_dut \qquad (7)$$

In step S8 this difference value is evaluated to determine whether the automatic test environment is acceptable. The socket pin electrical length is known from the socket specifications, while the electrical length of the shorting block for the device under test can be determined by measurement of the size of the shorting block, with the electrical length being, for example, 6 ps/mm×the socket length. By comparing this calculated electrical length with the result of equation (7), the correctness of the calibration of the automatic test environment can be determined. If the correctness is not satisfactory, then in step S9 adjustments, corrections, and/or improvements are made, and the process returns to step S2 to determine whether the result is acceptable. By way of example, tester driver 10, pin electronics card 12, and/or tester interface unit 16 might be adjusted or their design improved. If the correctness of the calibration, although not exact, is nevertheless within tolerances, corrections can be made to the results obtained during acceptance testing in order to obtain corrected results. Once an acceptable difference $\Delta 3$ is obtained in step S8, the method ends in step S10.

Figure 1:
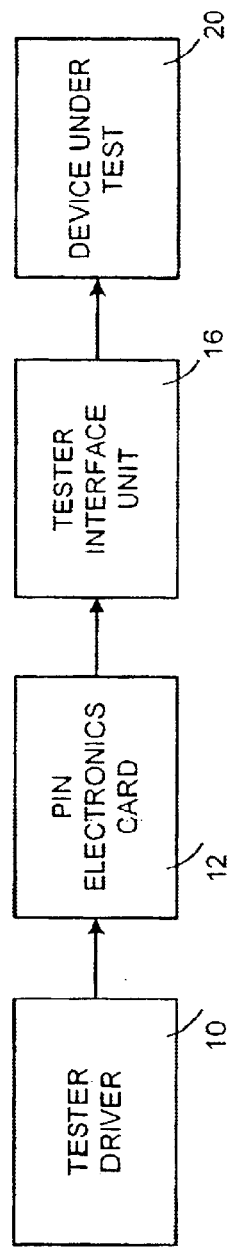
FIG. 1 is a block diagram commonly considered to depict an automatic test arrangement testing a device.
Figure 3:
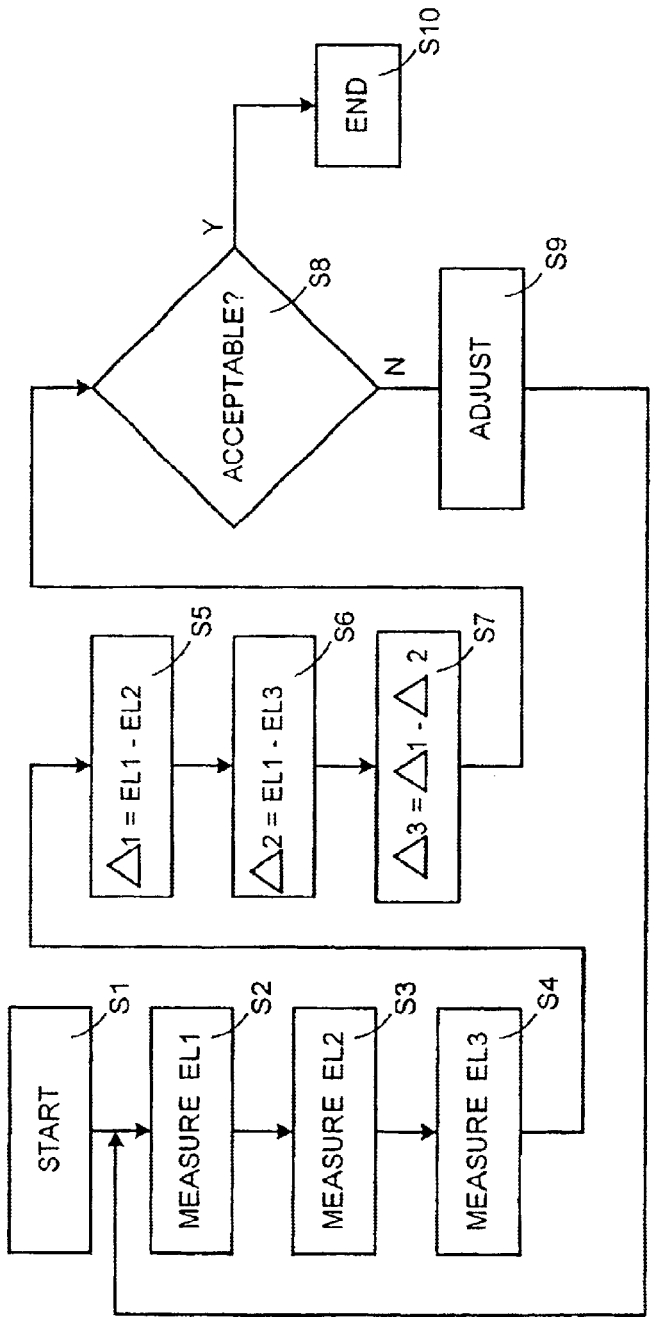
FIG. 3 is a flowchart of a first embodiment of a method of determining the correctness of the calibration of an automatic test arrangement in accordance with the present invention.

FIG. 3 is a flowchart of a second embodiment of a method for determining the correctness of the calibration of an automatic test environment in accordance with the present invention. The method of FIG. 3 differs from the method of FIG. 2 in steps S6 and S7. In step S6 the fourth electrical length is subtracted from the first electrical length, giving:

$$\Delta 2' = EL(1) - EL(4) = \text{Shortest return path to ground} - Shrt\_blk\_dut \qquad (8)$$

That result is then subtracted from the result of equation (5), giving:

$$\Delta 3' = \Delta 1 - \Delta 2' = Socket\_pin + Shrt\_blk\_dut \qquad (9)$$

Equations 6 and 8 are identical, and so equations 7 and 9 are also identical. Thus, the method of FIG. 2 gives the same result as the method of FIG. 3. The method of FIG. 3, however, requires an additional shorting block for the pogo pin. In practice, for any given automatic test environment the decision of whether to use the method of FIG. 2 or the method of FIG. 3 might be based on the method that gives the greatest repeatability.

Figure 5:
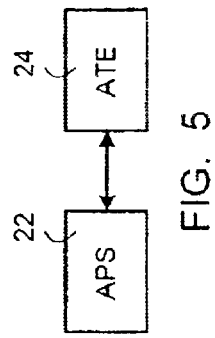
FIG. 5 is a block diagram of a preferred embodiment of apparatus for determining the correctness of an automatic test arrangement in accordance with the present invention.

The calibration of an automatic test arrangement can be determined by the present invention. An automatic test equipment or a tester interface unit can have the ability to determine $\Delta 3$ built in so that the calibration of the arrangement can be checked when desired. As depicted in FIG. 5, the present invention can also be implemented by a properly programmed automatic processing system 22 connected to the automatic test environment 24.

Although the present invention has been described with reference to preferred embodiments, various alternations, rearrangements, and substitutions can be made, and still the result would be within the scope of the invention.

What is claimed is:

1. A method of determining the correctness of the calibration of an automatic test arrangement testing a device, the automatic test arrangement including a tester driver, a pin electronics card having an input connected to the tester driver and an output connected to a first output pin, and a tester interface unit having an input connected to the first output pin and an output connected to a second output pin, said method comprising with the second output pin connected to the device under test, determining a first electrical length from the tester driver to a grounding point of the device under test; with no connection to the second output pin, determining a second electrical length from the tester driver to the tester interface unit output; with the second output pin connected to ground by a shorting block, determining a third electrical length from the tester driver to the ground; determining as a first difference value the difference between the first electrical length and the second electrical length; determining as a second difference value the difference between the first electrical length and the third electrical length; determining as a third difference value the difference between the first difference value and the second difference value; and evaluating the third difference value to determine the correctness of the calibration of the automatic test arrangement.

2. A method as claimed in claim 1, wherein the first electrical length is determined by determining the electrical length from the tester driver, through the pin electronics card, the first output pin, the tester interface unit, and the second output pin to a grounding point of the device under test.

3. A method as claimed in claim 2, wherein the first electrical length is determined by applying an input signal from the tester driver, through the pin electronics card, the first output pin, the tester interface unit, and the second output pin to the device under test; receiving a signal as a result of reflection of the input signal from the device under test; and determining the elapsed time between application of the input signal and receipt of the reflected signal.

4. A method as claimed in claim 1, wherein the second electrical length is determined by determining the electrical length from the tester driver, through the pin electronics card and the first output pin to the tester interface unit.

5. A method as claimed in claim 4, wherein the second electrical length is determined by determining as a first value the sum of the electrical length of the pin electronics card and an adjustment value for the pin electronics card; determining as a second value the sum of the electrical lengths of the pin electronics card, the first output pin, and the tester interface unit; determining a third value by subtracting the first value from the second value; and adding the first value and the third value.

6. A method as claimed in claim 1, wherein the third electrical length is determined with the second output pin connected to ground by a shorting block, by determining the electrical length from the tester driver, through the pin electronics card, the first output pin, the tester interface unit, the second output pin and the shorting block to ground.

7. A method as claimed in claim 6, wherein the third electrical length is determined by determining as a first value the sum of the electrical length of the pin electronics card and an adjustment value for the pin electronics card; determining as a second value the sum of the electrical lengths of the pin electronics card, the first output pin, the tester interface unit, the second output pin, and the shorting block; determining a third value by subtracting the first value from the fourth value; and adding the first value and the third value.

8. A method as claimed in claim 1, wherein the third difference value is evaluated by comparing the third difference value with the sum of the electrical lengths of the second output pin and the shorting block.

9. A method of determining the correctness of the calibration of an automatic test arrangement testing a device, the automatic test arrangement including a tester driver, a pin electronics card having an input connected to the tester driver and an output connected to a first output pin, and a tester interface unit having an input connected to the first output pin and an output connected to a second output pin, said method comprising with the second output pin connected to a device under test, determining a first electrical length from the tester driver to a grounding point of the device under test; with no connection to the second output pin, determining a second electrical length from the tester driver to the tester interface unit output; with the first output pin connected to ground by a first shorting block and the second output pin connected to ground by a second shorting block, determining a third electrical length from the tester driver, to the ground; determining as a first difference value the difference between the first electrical length and the second electrical length; determining as a second difference value the difference between the first electrical length and the third electrical length; determining as a third difference value the difference between the first difference value and the second difference value; and evaluating the third difference value to determine the correctness of the calibration of the automatic test arrangement.

10. A method as claimed in claim 9, wherein the first electrical length is determined by determining the electrical length from the tester driver, through the pin electronics card, the first output pin, the tester interface unit, and the second output pin to a grounding point of the device under test.

11. A method as claimed in claim 10, wherein the first electrical length is determined by applying an input signal from the tester driver, through the pin electronics card, the first output pin, the tester interface unit, and the second output pin to the device under test; receiving a signal as a result of reflection of the input signal from the device under test; and determining the elapsed time between application of the input signal and receipt of the reflected signal.

12. A method as claimed in claim 9, wherein the second electrical length is determined by determining the electrical length from the tester driver, through the pin electronics card and the first output pin to the tester interface unit.

13. A method as claimed in claim 12, wherein the second electrical length is determined by determining as a first value the sum of the electrical length of the pin electronics card and an adjustment value for the pin electronics card; determining as a second value the sum of the electrical lengths of the pin electronics card, the first output pin, and the tester interface unit; determining a third value by subtracting the first value from the second value; and adding the first value and the third value.

14. A method as claimed in claim 9, wherein the third electrical length is determined with the second output pin connected to ground by a shorting block, by determining the electrical length from the tester driver, through the pin electronics card, the first output pin, the tester interface unit, the second output pin and the shorting block to ground.

15. A method as claimed in claim 14, wherein the third electrical length is determined by determining as a first value the sum of the electrical length of the pin electronics card and an adjustment value for the pin electronics card; determining as a second value the sum of the electrical lengths of the pin electronics card, the first output pin, and the first shorting block; determining as a third value the sum of the second value and an adjustment value for the second value; determining as a fourth value the sum of the electrical lengths of the pin electronics card, the first output pin, the tester interface unit, the second output pin, and the second shorting block; determining a fifth value by subtracting the first value from the fourth value; and adding the third value and the fifth value.

16. A method as claimed in claim 9, wherein the third difference value is evaluated by comparing the third difference value with the sum of the electrical lengths of the second output pin and the shorting block.

17. An article, comprising a storage medium having instructions stored thereon, the instructions when executed determining the correctness of the calibration of an automatic test arrangement testing a device, the automatic test arrangement including a tester driver, a pin electronics card having an input connected to the tester driver and an output connected to a first output pin, and a tester interface unit having an input connected to the first output pin and an output connected to a second output pin, by with the second output pin connected to the device under test, determining a first electrical length from the tester driver to a grounding point of the device under test; with no connection to the second output pin, determining a second electrical length from the tester driver to the tester interface unit output; with the second output pin connected to ground by a shorting block, determining a third electrical length from the tester driver to the ground; determining as a first difference value the difference between the first electrical length and the second electrical length; determining as a second difference value the difference between the first electrical length and the third electrical length; determining as a third difference value the difference between the first difference value and the second difference value; and evaluating the third difference value to determine the correctness of the calibration of the automatic test arrangement.

18. An article as claimed in claim 17, wherein the instructions when executed determine the first electrical length by determining the electrical length from the tester driver, through the pin electronics card, the first output pin, the tester interface unit, and the second output pin to a grounding point of the device under test.

19. An article as claimed in claim 18, wherein the instructions when executed determine the first electrical length by applying an input signal from the tester driver, through the pin electronics card, the first output pin, the tester interface unit, and the second output pin to the device under test; receiving a signal as a result of reflection of the input signal from the device under test; and determining the elapsed time between application of the input signal and receipt of the reflected signal.

20. An article as claimed in claim 17, wherein the instructions when executed determine the second electrical length determined by determining the electrical length from the tester driver, through the pin electronics card and the first output pin to the tester interface unit.

21. An article as claimed in claim 20, wherein the instruction when executed determine the second electrical length by determining as a first value the sum of the electrical length of the pin electronics card and an adjustment value for the pin electronics card; determining as a second value the sum of the electrical lengths of the pin electronics card, the first output pin, and the tester interface unit; determining a third value by subtracting the first value from the second value; and adding the first value and the third value.

22. An article as claimed in claim 17, wherein the instructions when executed determine the third electrical length with the second output pin connected to ground by a shorting block, by determining the electrical length from the tester driver, through the pin electronics card, the first output pin, the tester interface unit, the second output pin and the shorting block to ground.

23. An article as claimed in claim 22, wherein the instructions when executed determine the third electrical length by determining as a first value the sum of the electrical length of the pin electronics card and an adjustment value for the pin electronics card; determining as a second value the sum of the electrical lengths of the pin electronics card, the first output pin, the tester interface unit, the second output pin, and the shorting block; determining a third value by subtracting the first value from the fourth value; and adding the first value and the third value.

24. An article as claimed in claim 17, wherein the instructions when executed evaluate the third difference value by comparing the third difference value with the sum of the electrical lengths of the second output pin and the shorting block.

25. An article, comprising a storage medium having instructions stored thereon, the instructions when executed of determining the correctness of the calibration of an automatic test arrangement testing a device, the automatic test arrangement including a tester driver, a pin electronics card having an input connected to the tester driver and an output connected to a first output pin, and a tester interface unit having an input connected to the first output pin and an output connected to a second output pin, by with the second output pin connected to a device under test, determining a first electrical length from the tester driver to a grounding point of the device under test; with no connection to the second output pin, determining a second electrical length from the tester driver to the tester interface unit output; with the first output pin connected to ground by a first shorting block and the second output pin connected to ground by a second shorting block, determining a third electrical length from the tester driver, to the ground; determining as a first difference value the difference between the first electrical length and the second electrical length; determining as a second difference value the difference between the first electrical length and the third electrical length; determining as a third difference value the difference between the first difference value and the second difference value; and evaluating the third difference value to determine the correctness of the calibration of the automatic test arrangement.

26. An article as claimed in claim 25, wherein the instructions when executed determine the first electrical length by determining the electrical length from the tester driver, through the pin electronics card, the first output pin, the tester interface unit, and the second output pin to a grounding point of the device under test.

27. An article as claimed in claim 26, wherein the instructions when executed determine the first electrical length by applying an input signal from the tester driver, through the pin electronics card, the first output pin, the tester interface unit, and the second output pin to the device under test; receiving a signal as a result of reflection of the input signal from the device under test; and determining the elapsed time between application of the input signal and receipt of the reflected signal.

28. An article as claimed in claim 25, wherein the instructions when executed determine the second electrical length by determining the electrical length from the tester driver, through the pin electronics card and the first output pin to the tester interface unit.

29. An article as claimed in claim 28, wherein the instructions when executed determine the second electrical length by determining as a first value the sum of the electrical length of the pin electronics card and an adjustment value for the pin electronics card; determining as a second value the sum of the electrical lengths of the pin electronics card, the first output pin, and the tester interface unit; determining a third value by subtracting the first value from the second value; and adding the first value and the third value.

30. An article as claimed in claim 25, wherein the instructions when executed determine the third electrical length with the second output pin connected to ground by a shorting block, by determining the electrical length from the tester driver, through the pin electronics card, the first output pin, the tester interface unit, the second output pin and the shorting block to ground.

31. An article as claimed in claim 30, wherein the instructions when executed determine the third electrical length by determining as a first value the sum of the electrical length of the pin electronics card and an adjustment value for the pin electronics card; determining as a second value the sum of the electrical lengths of the pin electronics card, the first output pin, and the first shorting block; determining as a third value the sum of the second value and an adjustment value for the second value; determining as a fourth value the sum of the electrical lengths of the pin electronics card, the first output pin, the tester interface unit, the second output pin, and the second shorting block; determining a fifth value by subtracting the first value from the fourth value; and adding the third value and the fifth value.

32. An article as claimed in claim 25, wherein the instructions when executed evaluate the third difference value by comparing the third difference value with the sum of the electrical lengths of the second output pin and the shorting block.

33. Apparatus comprising:
an automatic test arrangement including a tester driver, a pin electronics card having an input connected to the tester driver and an output connected to a first output pin, and a tester interface unit having an input connected to the first output pin and an output connected to a second output pin;
a device to be tested;
a shorting block;
means for determining, with the second output pin connected to the device under test, a first electrical length from the tester driver to a grounding point of the device under test;
means for determining, with no connection to the second output pin, a second electrical length from the tester driver to the tester interface unit output;
means for determining, with the second output pin connected to ground by the shorting block, a third electrical length from the tester driver to the ground;
means for determining as a first difference value the difference between the first electrical length and the second electrical length;
means for determining as a second difference value the difference between the first electrical length and the third electrical length;
means for determining as a third difference value the difference between the first difference value and the second difference value; and
means for evaluating the third difference value to determine the correctness of the calibration of the automatic test arrangement.

34. Apparatus as claimed in claim 33, comprising an automatic processing system.

35. Apparatus comprising:
an automatic test arrangement including a tester driver, a pin electronics card having an input connected to the tester driver and an output connected to a first output pin, and a tester interface unit having an input connected to the first output pin and an output connected to a second output pin;

a device to be tested;

a first shorting block;

a second shorting block;

means for determining, with the second output pin connected to the device under test, a first electrical length from the tester driver to a grounding point of the device under test;

means for determining, with no connection to the second output pin, a second electrical length from the tester driver to the tester interface unit output;

means for determining, with the first output pin connected to ground by the first shorting block and the second output pin connected to ground by the second shorting block, a third electrical length from the tester driver to the ground;

means for determining as a first difference value the difference between the first electrical length and the second electrical length;

means for determining as a second difference value the difference between the first electrical length and the third electrical length;

means for determining as a third difference value the difference between the first difference value and the second difference value; and means for evaluating the third difference value to determine the correctness of the calibration of the automatic test arrangement.

36. Apparatus as claimed in claim 35, comprising an automatic processing system.

* * * * *

UNITED STATES PATENT AND TRADEMARK OFFICE
CERTIFICATE OF CORRECTION

PATENT NO.    : 6,829,553 B2
DATED         : December 7, 2004
INVENTOR(S)   : Sunil K. Jain et al.

It is certified that error appears in the above-identified patent and that said Letters Patent is hereby corrected as shown below:

Column 8,
Line 13, "by with the second output pin" should read -- with the second output pin --.
Lines 50-51, "the instruction....determine the second" should read -- the instructions… determine the second --.

Column 9,
Lines 14-15, "the instruction when executed" should read -- the instructions when executed --.
Line 21, "by with the second output" should read -- with the second output --.

Signed and Sealed this

Fourteenth Day of March, 2006

JON W. DUDAS
*Director of the United States Patent and Trademark Office*